US010665632B2

(12) United States Patent
Reverchon et al.

(10) Patent No.: US 10,665,632 B2
(45) Date of Patent: May 26, 2020

(54) METHOD FOR MANUFACTURING A PHOTOSENSOR COMPRISING A STACK OF LAYERS PLACED ON TOP OF EACH OTHER

(71) Applicants: THALES, Courbevoie (FR); COMMISSARIAT À L'ÉNERGIE ATOMIQUE ET AUX ÉNERGIES ALTERNATIVES, Paris (FR)

(72) Inventors: Jean-Luc Reverchon, Palaiseau (FR); Axel Evirgen, Palaiseau (FR); Florian Le Goff, Palaiseau (FR)

(73) Assignees: THALES, Courbevoie (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/316,010

(22) PCT Filed: Jul. 6, 2017

(86) PCT No.: PCT/EP2017/066951
§ 371 (c)(1),
(2) Date: Jan. 7, 2019

(87) PCT Pub. No.: WO2018/007529
PCT Pub. Date: Jan. 11, 2018

(65) Prior Publication Data
US 2019/0157338 A1    May 23, 2019

(30) Foreign Application Priority Data
Jul. 8, 2016  (FR) ..................... 16 01066

(51) Int. Cl.
*H01L 27/146*      (2006.01)
*H01L 31/101*      (2006.01)

(52) U.S. Cl.
CPC .... *H01L 27/14694* (2013.01); *H01L 27/1465* (2013.01); *H01L 27/1467* (2013.01);
(Continued)

(58) Field of Classification Search
CPC ................. H01L 27/14689; H01L 27/14636
See application file for complete search history.

(56) References Cited

U.S. PATENT DOCUMENTS

| 2011/0156273 A1 | 6/2011 | Puhakka et al. |
| 2014/0225064 A1* | 8/2014 | Khoshakhlagh ............ H01L 31/035236 257/21 |
| 2017/0229509 A1* | 8/2017 | Lee ................... H01L 27/14643 |

FOREIGN PATENT DOCUMENTS

WO    WO 2005/086236 A1    9/2005

OTHER PUBLICATIONS

International Search Report of related International Patent Application No. PCT/EP2017/066951 dated Aug. 8, 2017.

* cited by examiner

*Primary Examiner* — Farun Lu
(74) *Attorney, Agent, or Firm* — Arent Fox LLP

(57) ABSTRACT

The invention relates to a method for manufacturing a photodetector able to operate for the photodetection of infrared electromagnetic waves, comprising a stack of thin layers placed on top of one another. The method includes obtaining a first assembly ($E_1$) of stacked layers, forming a detection assembly, comprising a first substrate layer, a photoabsorbent layer, a barrier layer and at least one contact layer, and a second assembly ($E_2$) of stacked layers forming a reading circuit, comprising at least one second substrate layer and a multiplexing layer. The first and second assemblies are glued between the contact layer of the first assembly and the multiplexing layer of the second assembly.

(Continued)

Etching through the second assembly makes it possible to obtain a plurality of interconnect vias, then p or n doping of zones of the first contact layer of the first assembly through the interconnect vias.

11 Claims, 4 Drawing Sheets

(52) U.S. Cl.
CPC .... *H01L 27/1469* (2013.01); *H01L 27/14636* (2013.01); *H01L 27/14669* (2013.01); *H01L 27/14689* (2013.01); *H01L 27/14692* (2013.01); *H01L 31/101* (2013.01)

METHOD FOR MANUFACTURING A PHOTOSENSOR COMPRISING A STACK OF LAYERS PLACED ON TOP OF EACH OTHER

CROSS-REFERENCE TO RELATED APPLICATIONS

This application is a National Stage Entry of International Patent Application No. PCT/EP2017/066951, filed Jul. 6, 2017, which claims priority to French Patent Application No. 16 01066, filed Jul. 8, 2016. The disclosure of the priority application incorporated in their entirety herein by reference.

FIELD OF THE INVENTION

The present invention relates to a method for manufacturing a photosensor comprising a stack of layers placed on top of each other for infrared imaging.

BACKGROUND OF THE INVENTION

The invention falls within the field of infrared imaging, corresponding to wavelengths of between 900 nm (nanometers) and 25 μm (micrometers). In this field, photodetectors comprising a photo-absorbent layer made from semiconductor material are used. A photo-absorbent layer is a layer absorbing the photons belonging to a predefined range of wavelengths.

The dark current is one of the main limitations on the performance of a photodetector. The current has a diffusion component in the neutral zones and exacerbated generation-recombination component in the deserted zones. The origin of the dark current includes Shockley-Read generation-recombination, radiative generation-recombination or Auger generation-recombination components with different thermal activation laws.

To improve the performance of the detecting structure, barrier layers are generally superimposed on either side of the absorption layer. A barrier layer is a layer preventing the passage of the majority carriers and allowing the minority carriers to pass. It additionally makes it possible to prevent the formation of a space filler zone and therefore even further limits the dark current.

Such photodetectors comprising a structure with a stack of layers, forming a detection circuit, obtained by epitaxy on a substrate, comprising a barrier layer, for example made from aluminum-gallium arsenide-antimonide (AlGaAsSb), stacked on an absorption layer made from indium arsenide antimonide (InAsSb) on a substrate made from gallium antimonide (GaSb), have an operating temperature of 130 K to 250 K.

The photodetector comprises semi conductor contacts, each contact having an end part in contact with at least one space charge zone. Each contact makes it possible to collect a current formed by the movement of the charge carriers, in the charge zone centered on said contact.

Thus, a photodetection matrix formed by pixels is produced, the pixels each having a length and a width, in general equal and commonly called "pitch of the pixel".

One known method for producing such a photodetector uses an assembly of indium beads between the photodetection circuit and a reading circuit made from silicon technology intended to collect the current formed by the movement of the charge carriers and convert it into a video signal usable by an image processing chain. The use of indium beads limits the pixel pitch to about 10 μm.

Yet it is desirable for certain applications to decrease the size of the pixel pitch.

Another alternative assembly method is a metallization method known under the name "loop-hole" consisting of producing contacts through the detection circuit. Applied to a structure with a stack of layers as described above, such a method would require placing an etching through the absorption layer, which is an active layer of the stack. This would create a lateral desertion zone in the absence of a barrier along the edge zone, and therefore a strong dark current.

The invention aims to resolve the aforementioned drawbacks, by proposing a method for manufacturing a photodetector with a stack of superimposed layers comprising at least one barrier layer, making it possible to achieve pixel pitches smaller than 10 μm, while limiting the dark current and allowing an operation at temperatures greater than or equal to 150K.

SUMMARY OF THE INVENTION

To that end, according to a first aspect, the invention proposes a method for manufacturing a photodetector able to operate for the photodetection of infrared electromagnetic waves, comprising a stack of thin layers placed on top of one another. This method comprises the following steps:

obtaining a first set of stacked layers, forming a detection assembly, comprising a first layer of substrate made from a first semiconducting substrate material, a photoabsorbent layer made from an active semiconductor material, a barrier layer made from a semiconductor barrier material and at least one contact layer made from a first semiconductor contact material, and at least one second set of stacked layers forming a reading circuit, comprising at least one second substrate layer and a multiplexing layer made from a second semiconductor contact material, gluing said first and second assembly of stacked layers between the contact layer of the first assembly and the multiplexing layer of the second assembly, etching through said second assembly of a plurality of interconnect vias, p or n doping of zones of the contact layer of the first assembly through said interconnect vias.

Advantageously, the proposed manufacturing method makes it possible to reduce the pixel pitch while making it possible to maintain reduced manufacturing costs.

The photodetector manufacturing method according to the invention may also have one or more of the features below, considered independently or according to all technically acceptable combinations.

In the etching step, the interconnect vias are substantially identical and regularly positioned in a predetermined positioning grid, so as to form a matrix of photodetection pixels.

The interconnect vies are cylindrical or parallelepiped.

The method comprises a step for thinning of the second substrate layer of the second assembly after the gluing step and before the etching step.

The method further comprises a step for adding ohmic contacts in the plurality of interconnect vias.

According to one alternative, the doping is done by diffusion.

According to one alternative, the doping is done by implantation.

The first assembly of stacked layers is obtained by epitaxy on the first substrate layer.

The method includes, after the gluing step, removing the first substrate layer and adding, by gluing, a third stiffening substrate layer.

The multiplexing layer of the second assembly of layers is made from silicon.

The gluing of said first and second assemblies of stacked layers is done by molecular adhesion.

The reading circuit is a circuit of the CMOS type.

BRIEF DESCRIPTION OF THE DRAWINGS

Other features and advantages of the invention will emerge from the description thereof provided below, for information and non-limitingly, in reference to the appended figures, in which.

DETAILED DESCRIPTION OF EMBODIMENTS

The invention is described below in various embodiments.

According to a first embodiment, the manufacturing method is intended to produce an infrared photodetector with a stack of layers comprising a substrate layer made from a first semiconductor material, called first semiconductor substrate material, a photo-absorbent layer made from a semiconductor material, called active semiconductor material, a barrier layer made from a semiconductor material, called semiconductor barrier material, and a contact layer made from a semiconductor material, called semiconductor contact material.

The manufactured photodetector Pd has a spectral operating range from among one of the following spectral operating ranges; the near infrared, the medium infrared and the far infrared.

A wave belongs to the infrared range if its wavelength is, broadly speaking, between 900 nm and 25 µm.

A wave belongs to the near infrared if its wavelength is, broadly speaking, between 900 nm and 3 µm.

A wave belongs to the medium infrared if its wavelength is broadly speaking, between 3 µm and 5 µm.

A wave belongs to the far infrared if its wavelength is, broadly speaking, between 5 µm and 25 µm.

Figure 1:
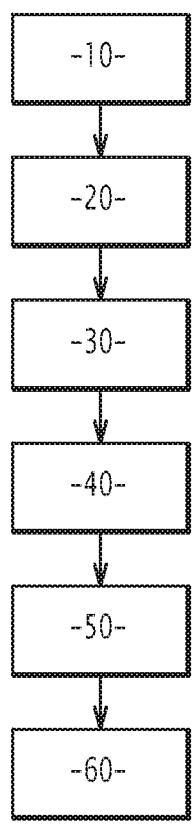
FIG. 1 is a block diagram of the main steps of a method for manufacturing a photodetector according to one embodiment of the invention.

FIG. 1 is a block diagram of the main steps of a method according to one embodiment.

FIGS. 2 to 7 illustrate portions of a stack of layers formed at the end of the various steps of the described manufacturing method.

A photodetector Pd is produced. The stacks of layers are shown in a spatial coordinate system (X, Y, Z), X designating the longitudinal direction, Y designating the transverse direction, Z designating the stacking direction.

The stacking direction Z corresponds to a general propagation direction of the light.

It should be noted that the illustrations of FIGS. 2 to 7 are schematic and are not to scale for a functional photodetector.

During a first step 10, a first assembly $E_1$ of stacked layers is obtained, forming a detection assembly, also called detection circuit.

Figure 2:
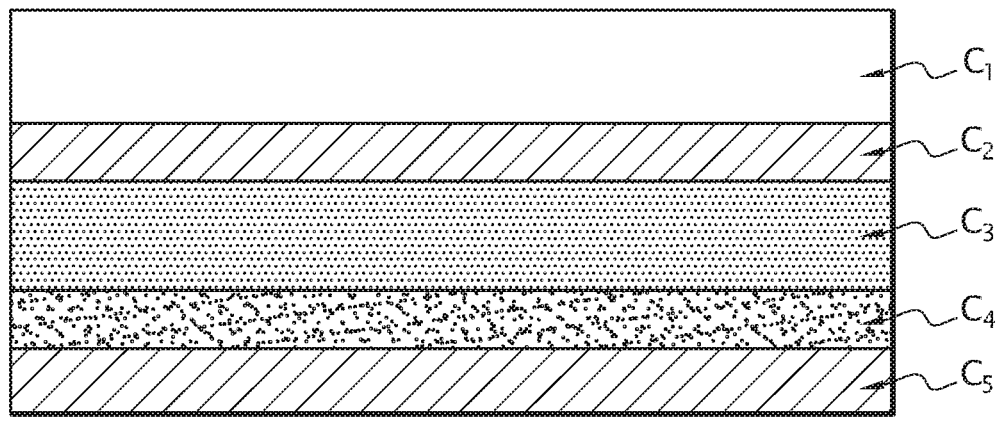
FIGS. 2 to 7 are schematic sectional views of an example photodetector at the end of the steps of the method of FIG. 1.
Figure 2:
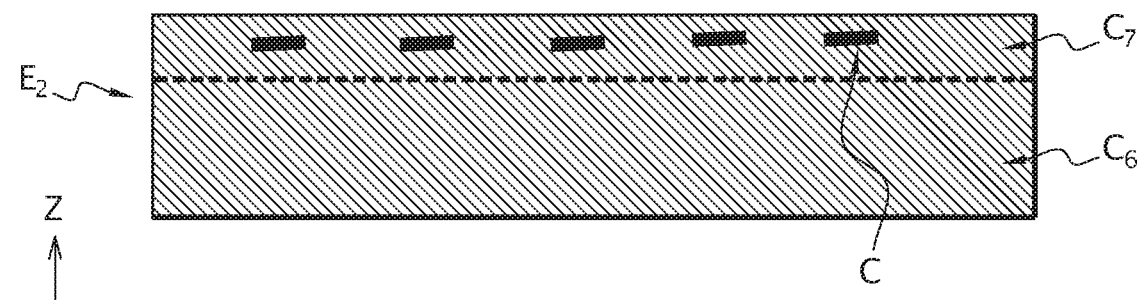

A first assembly of stacked layers $E_1$ according to one embodiment is illustrated in FIG. 2.

In one embodiment, the first assembly $E_1$ of stacked layers includes a substrate layer $C_1$ made from a first semiconductor substrate material, referred to as material $M_1$.

The substrate layer $C_1$ is transparent in the spectral operating range of the photodetector Pd.

The term "Transparent" is used to indicate that the layer absorbs less than 10% of the incident light and belongs to the spectral operating range of the photodetector Pd when the thickness along the stacking direction Z of the layer is less than around ten micrometers.

The material $M_1$ is chosen to have mesh parameters allowing epitaxial growth of one or several crystalline layers on the material $M_1$. The mesh parameters of the crystal for example refer to three lengths and three angles used to describe the mesh of the crystal.

The material $M_1$ is also chosen so as to have mesh parameters making it possible to avoid the formation of crystalline flaws during the epitaxial growth of one or several layers on the material $M_1$.

The material $M_1$ may or may not be a composite material. A composite material is an assembly of at least two materials, each material being an element or an alloy. Each material forming material $M_1$ belongs to one of the columns of the periodic table of elements from among the following columns: IIB, IIIA, IVA, VA and VIA. The periodic table used is the table by increasing atomic number established by Moseley in the early 20th century.

Group II of the periodic sable is also called group 12. Group II in particular comprises zinc (Zn), cadmium (Cd) and mercury (Hg).

Group III of the periodic table is also called group 13. Group III corresponds to the boron group and in particular comprises boron (B), aluminum (Al), gallium (Ga) and indium (In).

Group IV of the periodic table is also called group 14. Group IV in particular comprises silicon (Si) and germanium (Ge).

Group V of the periodic table is also called group 15 or nitrogen family. Group V in particular comprises nitrogen (N), phosphorus (P), arsenic (As) and antimony (Sb).

Group VI of the periodic table is also called group 16. Group VI in particular comprises oxygen (O), sulfur (S) and selenium (Se).

Advantageously, the materials from columns III and II may respectively be associated with materials from columns V and VI to produce hetero-structures for photodetectors. These will be called II-VI or III-V alloys.

The material $M_1$ is for example gallium arsenide (GaAs), indium phosphide (InP), indium antimonide (InSb), or gallium antimonide (GaSb). The gallium arsenide and gallium antimonide have the advantage of being direct, gap materials. A direct gap material is a favored material for emitting light after an electron-hole recombination.

Optionally, in the case where the material $M_1$ is not gallium antimonide, an additional buffer layer is superimposed on the first substrate layer $C_1$. The additional buffer layer make it possible to bring the mesh tuning material $M_1$ closer on the gallium antimonide.

The material $M_1$ has a first gap (or bandgap) $E_g^1$.

The substrate layer $C_1$ has a thickness $z_1$ along the stacking direction Z, broadly speaking of between 300 µm and 900 µm before thinning, then between 300 nm and 10 µm after thinning. Furthermore, the doping of the substrate is chosen to optimize its quality and its transparency.

The first assembly $E_1$ includes, stacked on the substrate layer $C_1$, or, if applicable, on the additional buffer layer, an interface layer $C_2$, made from a semiconductor material $M_2$, here called semiconductor interface material.

This substrate layer $C_2$ has a thickness $z_2$ along the stacking direction Z, broadly speaking of between 50 nm and 1 μm. Its role is to guarantee good shared electrical contact while limiting the generation of dark current.

The semiconductor material $M_2$ is n or p doped.

The term "n doping" refers to the introduction of impurities into a semiconductor so as to produce excess electrons. The term "p doping" refers to the introduction of impurities into a semiconductor so as to produce an electron deficit.

The interface layer $C_2$ has a second gap $E_g^2$ smaller than the first gap $E_g^1$ of the first semiconductor substrate material.

An active layer $C_3$, which is photo-absorbent, is stacked on the interface layer $C_2$. In the rest of the description, the expression "photo-absorbent layer" refers to a layer absorbing at least 10%, and preferably at least 50%, of the photons belonging to the spectral operating range of the photodetector Pd and arriving on the photo-absorbent layer.

The photo-absorbent layer $C_3$ is made from a semiconductor material, here called active semiconductor material, referred to as material $M_3$.

The material $M_3$ is chosen to be in mesh agreement with the material $M_2$ of the interface layer $C_2$, the material $M_2$ in turn being in mesh agreement with the material $M_1$ except when an additional buffer layer is used.

The material $M_3$ may or may not be a composite material. Each material forming material $M_3$ belongs to one of the columns of the periodic table from among the following columns: IIB, IIIA, VA and VIA. Advantageously, the material $M_3$ is a II-VI or III-V alloy.

The material $M_3$ is n or p doped.

The doping level of the material $M_3$ is broadly speaking between $10^{14}$ cm$^{-3}$ and $10^{18}$ cm$^{-3}$. The doping level is defined as the number of dopants in a cubic centimeter of the crystalline network. The doping level is by volume.

When the material $M_3$ is n or p doped, the material $M_2$ is for example chosen from among: indium arsenide antimonide (InAsSb), digital alloys of indium arsenide antimonide and indium aresnide and super-networks of indium arsenide and gallium antimonide.

A super-network is a periodic stack of thin layers making it possible to generate a material with a different gap from the original materials. A digital alloy is a super-network with layers with fine enough periods for the carriers to be insensitive to the structuring.

The material $M_3$ has a third gap $E_g^3$, smaller than the first gap $E_g^1$ of the substrate layer $C_1$ and smaller than the second gap $E_g^2$ of the interface layer $C_2$.

The photo-absorbent layer $C_3$ has a thickness $z_3$ along the stacking direction Z, which is of the order of magnitude of the optical absorption length of a photon. The optical absorption length of a photon in a given material is the optical path traveled by the photon in the material before the photon is absorbed in the material according to an exponential absorption law such as the Beer-Lambert law. More specifically, the thickness $z_3$ is broadly speaking between 100 nm and 20 μm.

The first assembly $E_1$ includes, in contact with the photo-absorbent layer $C_3$, a barrier layer $C_4$.

In the rest of the description, the expression "barrier layer" refers to a layer forming a potential barrier on the valence band to block the holes or on the conduction band to block the electrons.

The barrier layer $C_4$ is transparent in the spectral operating range of the photodetector Pd.

The barrier layer $C_4$ is made from a semiconductor material, called semiconductor barrier material, referred to as material $M_4$.

The material $M_4$ is chosen to be in mesh agreement with the material $M_3$ or in quasi-mesh agreement in the case where the material $M_3$ is aluminum-gallium arsenide-antimonide (AlGaAsSb). The expression "quasi-mesh agreement" signifies a mesh disagreement of less than 0.05%.

The material $M_4$ may or may not be a composite material. Each material forming material $M_4$ belongs to one of the columns of the periodic table from among the following columns: IIB, IIIA, VA and VIA. Advantageously, the material $M_4$ is a II-VI or III-V alloy.

The material $M_4$ is weakly doped or not doped. In particular, the material $M_4$ is not doped or weakly n doped when the material $M_3$ is n doped and is not doped or weakly p doped when the material $M_3$ is p doped.

The doping level of the material $M_4$ is broadly speaking between $10^{13}$ cm$^{-3}$ and $10^{18}$ cm$^{-3}$.

When the material $M_3$, preferably InAsSb, is n doped, the material $M_4$ is for example chosen from among: aluminum-gallium antimonide (AlGaSb) and aluminum-gallium arsenide-antimonide (AlGaAsSb). In this case, the material $M_4$ has a strong conduction band discontinuity making it possible to block the electrons.

When the material $M_3$ is p doped, the material $M_4$ is for example gallium antimonide.

The material $M_4$ has a fourth gap $E_g^4$. The fourth gap $E_g^4$ is greater strictly speaking than the third gap $E_g^3$ of the photo-active layer $C_3$.

This substrate layer $C_4$ has a thickness $z_2$ along the stacking direction Z, broadly speaking, of between 30 nm and 1 μm.

Lastly, the first assembly $E_1$ comprises a contact layer $C_5$, made from a semiconductor material, called semiconductor contact material, referred to as material $M_5$, This contact layer $C_5$ has a thickness $z_5$ along the stacking direction Z, broadly speaking of between 10 nm and 1 μm. The material $M_5$ of the layer $C_5$ is chosen so as to allow good electrical surface passivation.

The first assembly $E_1$ of stacked layers is obtained by epitaxy on the substrate layer $C_1$.

This first assembly $E_1$ has a total thickness $z_{tot}$ along the stacking direction Z of between 1 and 10 μm.

Here are several non-exhaustive examples of materials respectively usable for the interface layer $C_2$ and for the photo-absorbent layer $C_3$ to produce a detection assembly $E_1$ described above.

For an operation in the near infrared or SWIR (for "shortwave infrared"):
  material $M_3$: indium gallium arsenide (InGaAs), material $M_2$: indium phosphide (InP);
  material $M_3$: silicon germanium (SiGe) or germanium (Ge), material $M_2$: silicon.

For an operation in the medium infrared or MWIR (for "medium wave infrared"):
  material $M_3$: indium arsenide-antimonide (InAsSb), or indium arsenide (InAs), material $M_2$ with formula $Al_xGa_{(1-x)}As_ySb_{(1-y)}$, with x equal to 0 or 1, y equal to 0 or 1;
  material $M_3$: indium antimonide (InSb), material $M_2$: indium aluminum antimonide (InAlSb).

For an operation in the far infrared or LWIR (for "long wave infrared"):

material $M_3$: gallium antimonide (GaSb) or indium arsenide (InAs), material $M_2$ with formula $Al_xGa_{(1-x)}As_ySb_{(1-y)}$, with x equal to 0 or 1, y equal to 0 or 1.

During the first step 10 of the method, one also obtains a second assembly of stacked layers $E_2$, forming a reading circuit, intended to make it possible to collect the current formed by the movement of the charge carriers in the detection assembly $E_1$.

In one embodiment, the second assembly $E_2$ is a circuit of the CMOS ("complementary metal oxide semiconductor") type comprising a substrate layer $C_6$, which is a second substrate layer, made from a semiconductor material called second semiconductor substrate material and referred to as material $M_6$.

The second assembly $E_2$ also includes a multiplexing layer $C_7$, which comprises a set of metal contacts C and which implements electrical functionalities of a CMOS circuit, in particular transistors.

The semiconductor material $M_6$ is for example silicon (Si).

The substrate layer $C_6$ has a thickness $z_6$ in the stacking direction of one or several hundred micrometers, for example around 600 μm.

The multiplexing layer $C_7$ is made from a second semiconductor contact material, called material $M_7$. In one embodiment, the material $M_7$ is silicon in which multiplexing functionalities are implemented (CMOS circuit).

Alternatively, it is possible to use materials other than silicon to implement electrical functionalities of a reading circuit.

Each contact element C is made from a metal material, for example aluminum or copper, adapted to silicon foundries, in particular adapted to the CMOS technology.

The first step 10 of the manufacturing method is followed by a step 20 for gluing the first assembly $E_1$ and the second assembly $E_2$, done between the contact layer $C_5$ of the first assembly $E_1$ and the contact layer $C_7$ of the second assembly $E_2$.

In one embodiment, the gluing is molecular gluing, done, by silica/silica double encapsulation.

Alternatively, any other type of molecular gluing can be considered, for example: SiN/SiN, SiOx/SiOx, Polymer (BCB), SiN/semiconductor, SiOx/semiconductor, Metal/metal.

According to an optional alternative, step 20 also includes the removal of the first substrate layer $C_1$ and its replacement with a stiffened substrate layer $C'_1$, with thickness $z'_1$ in the stacking direction Z, the thickness $z'_1$ being slightly greater than the thickness $z_1$ of the first substrate layer $C_1$.

The stiffened substrate layer is made from a material suitable for the mechanical strength and the technological processes, for example silicon, or any other rigid, material used in the technological processes for the industrial manufacture of integrated circuits.

Figure 3:
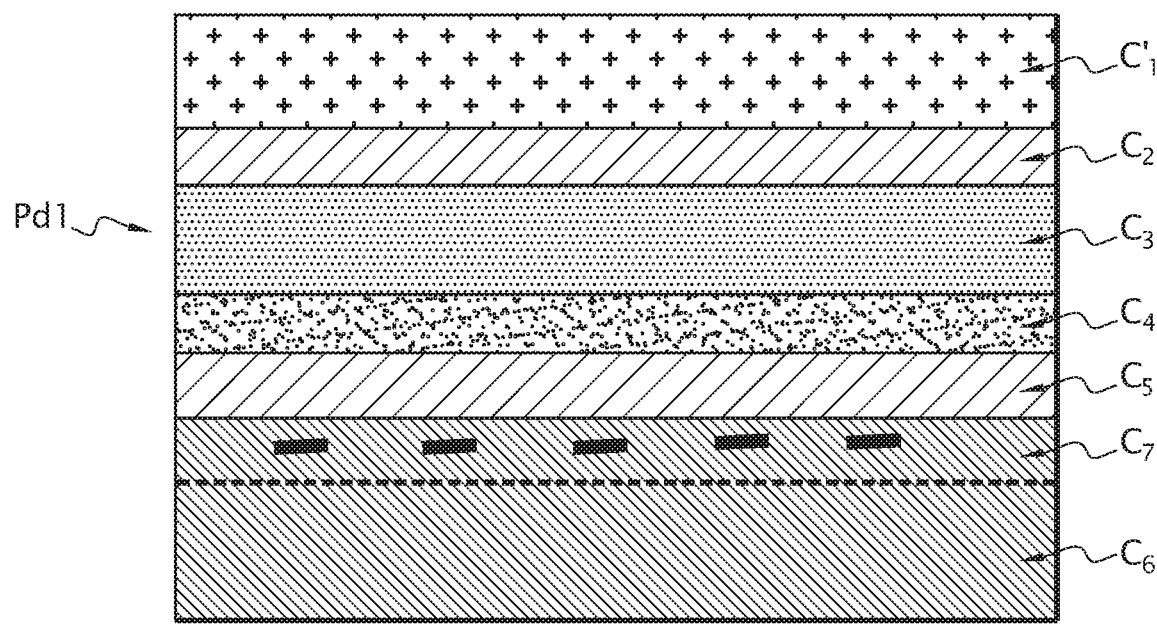

At the end of the gluing step 20, a stacking structure of thin layers denoted Pd1 is obtained, as schematically illustrated in FIG. 3.

The gluing step 20 is followed by a thinning step 30 consisting of thinning or eliminating the substrate layer $C_6$ coming from the second assembly $E_2$.

For example, the smart-cut® thinning technology is applied to reduce the thickness of said substrate layer $C_6$.

For example, in one, embodiment, the substrate layer $C_6$ has a thickness $z_6$ in the stacking direction of about 600 μm initially, and after the elimination and thinning step 30, the thickness of said substrate layer is about 5 μm, preferably less than 10 μm.

The remaining part of the second assembly $E_2$ at the end of step 30 is denoted $R_7$. The remaining part R7 comprises at least the multiplexing layer $C_7$ of the second assembly $E_2$.

Figure 4:
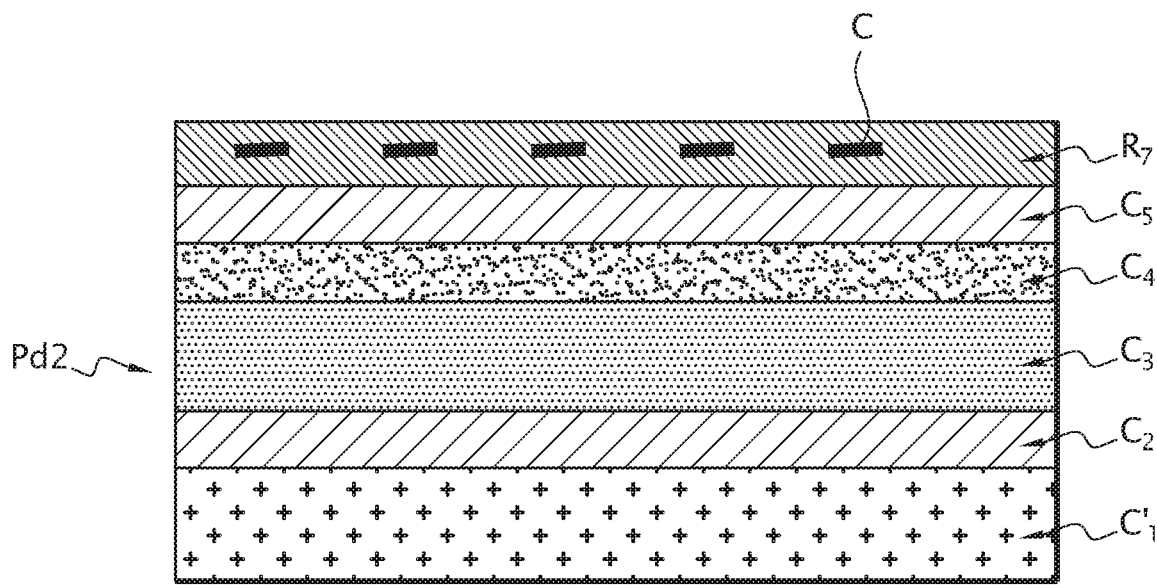

FIG. 4 illustrates a stacked structure of thin layers denoted Pd2 obtained at the end of step 30, in which the substrate layer $C_6$ has been eliminated in the thinning step 30.

The thinning step 30 is followed by a step 40 for etching interconnect conduits D, also called interconnect vias, through the remaining part $R_7$ of the second assembly $E_2$ after the thinning step 30.

The etching is done along the stacking axis Z.

Each interconnect via D has a depth substantially equal to the thickness of the remaining part $R_7$ of the second assembly $E_2$ after the thinning step 30.

Figure 5:
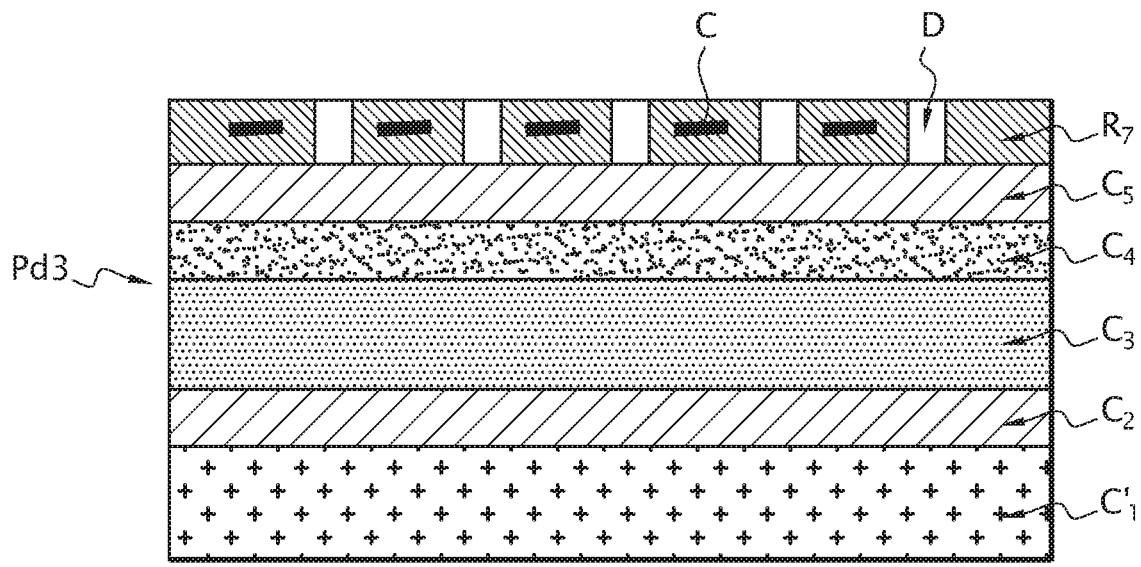

The interconnect vias D are substantially identical and regularly positioned in a predetermined positioning grid, so as to form a matrix of photodetection pixels. Such interconnect vias D are illustrated in FIG. 5.

In one embodiment, the interconnect vias D are cylindrical, with a diameter of between 50 nm and 5 μm.

Alternatively, each interconnect via D is in the form of a rhomb. For example, each interconnect via D has a length in the longitudinal direction X broadly speaking between 50 nm and 5 μm and a width in the transverse direction Y broadly speaking between 50 nm and 5 μm.

Step 40 for forming interconnect vias D is followed by a step 50 for doping through the interconnect vias D and the contact layer $C_5$.

The doping is, either p doping or n doping.

The doping is done with a doping level broadly speaking between $10^{15}$ cm$^{-3}$ and $10^{20}$ cm$^{-3}$.

The doping is done by diffusion or by implantation.

The diffusion of the dopant: mechanism for migration of the dopant element in a crystalline material. The diffusion edge is oriented from a rich phase on the surface of the material toward the inside thereof. When the host medium is of the type opposite that of the dopant, the, diffusion thus makes it possible to form a p-n semiconductor junction.

Doping by implantation consists of accelerated ion bombardment, allowing the controlled insertion of the elements into the mesh, which, after healing annealing, become dopants. The nature of the dopants is chosen to be opposite that of the semiconductor in which the implantation takes place, thus creating a p-n semiconductor junction.

Figure 6:
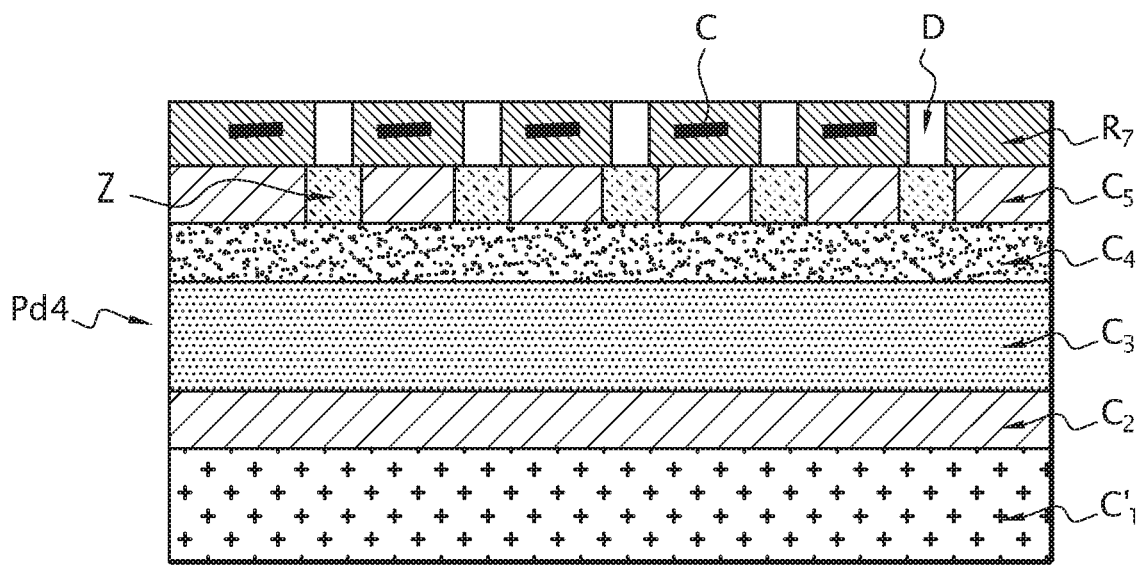
Figure 7:
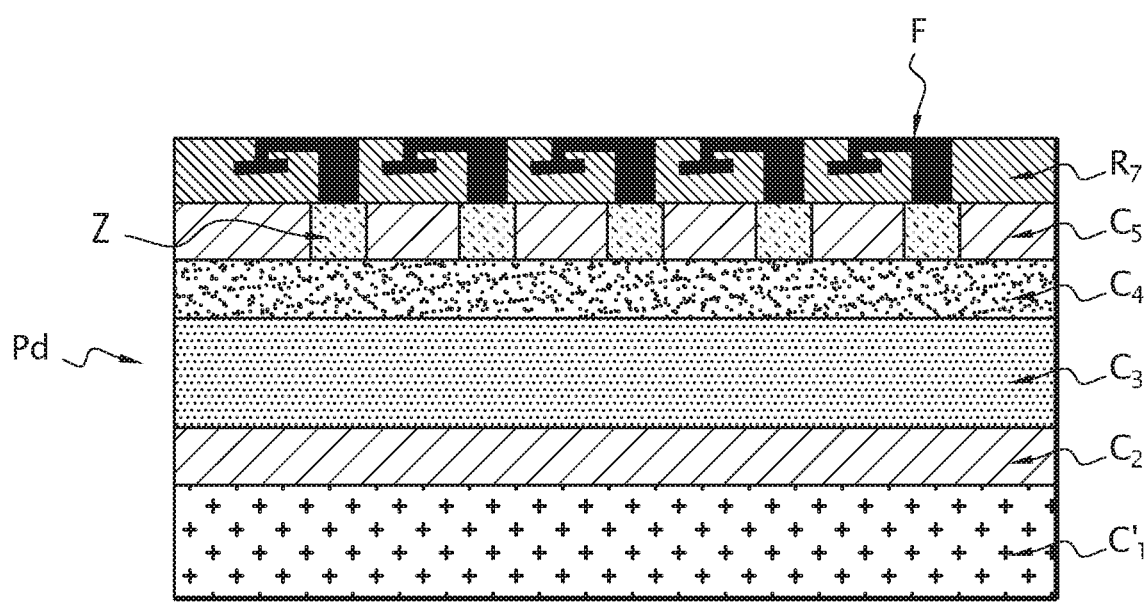

The doping makes it possible to generate doped zones Z, each zone Z being substantially centered around a corresponding interconnect via D. Such zones Z are illustrated in FIG. 6.

The doping step 50 is also called pixelization step, since it make it possible to generate photodetection zones where the current is collected owing to the interconnect vies D, making it possible to form photodetection pixels. The pixels are independent and isolated from one another.

Lastly, the pixelization step 50 is followed by a step 60 for finalizing the connector technology, consisting of forming ohmic contacts F between the doped zones and contact elements C of the contact layer $C_7$, through the interconnect channels D.

For example, the interconnect vias D are filled with a metal material, for example by spraying.

Preferably, one uses the metal material used for the contacts C, for example titanium, platinum or gold, suitable for producing ohmic contact.

The contacts F thus produced allow the reading of a current associated with each doped zone Z, and therefore of an electric signal associated with each pixel of the matrix of photodetection pixels.

Thus, the final photodetector is obtained at the end of the step 60 for finalizing the connector technology.

Advantageously, when the first assembly $E_1$ comprises a photo-absorbent layer made from indium arsenide-antimonide (InAsSb) on a substrate layer made from gallium antimonide (GaSb), the operating temperature of the photodetector will be greater than or equal to 150 K.

Furthermore, advantageously, the separate provision of the first detection assembly $E_1$ and the second reading assembly $E_2$ allows, manufacturing according to optimized manufacturing methods for each of these assemblies. The manufacturing method is done in parallel on a large number of imagers, and therefore the costs of producing photodetectors are reduced.

Advantageously, the thinning of the substrate layer of the reading circuit makes it possible to produce a matrix of photodetectors with a smaller pixel pitch, and smaller than 10 µm.

The invention claimed is:

1. A method for manufacturing a photodetector able to operate for the photodetection of infrared electromagnetic waves, comprising a stack of thin layers placed on top of one another, the method comprising:
    obtaining a first assembly of stacked layers, forming a detection assembly, comprising a first substrate layer made from a first semiconducting substrate material, a photoabsorbent layer made from an active semiconductor material, a barrier layer made from a semiconductor barrier material and at least one contact layer made from a first semiconductor contact material, and
    a second assembly of stacked layers forming a reading circuit, comprising at least one second substrate layer and a multiplexing layer made from a second semiconductor contact material,
    gluing said first and second assembly of stacked layers between the contact layer of the first assembly and the multiplexing layer of the second assembly,
    etching through said second assembly of a plurality of interconnect vias,
    p or n doping of zones of the contact layer of the first assembly through said interconnect vias.

2. The method according to claim 1, wherein in the etching step, said interconnect vias are substantially identical and regularly positioned in a predetermined positioning grid, so as to form a matrix of photodetection pixels.

3. The method according to claim 1, wherein said interconnect vias are cylindrical or parallelepiped.

4. The method according to claim 1, further comprising a step for thinning of the second substrate layer of the second assembly after the gluing step and before etching step.

5. The method according to claim 1, further comprising adding ohmic contacts in the plurality of interconnect vias.

6. The method according to claim 1, wherein the doping is done by diffusion.

7. The method according to claim 1, wherein the doping is done by implantation.

8. The method according to claim 1, wherein the first assembly of stacked layers is obtained by epitaxy on the first substrate layer.

9. The method according to claim 1, including, after the gluing step, removing the first substrate layer and adding, by gluing, a third stiffening substrate layer.

10. The method according to claim 1, wherein the multiplexing layer of the second assembly of layers is made from silicon.

11. The method according to claim 1, wherein the reading circuit is a circuit of the CMOS type.

* * * * *